US010950635B2

(12) United States Patent
Lee et al.

(10) Patent No.: US 10,950,635 B2
(45) Date of Patent: Mar. 16, 2021

(54) ORTHOGONAL TRANSISTOR LAYOUTS

(71) Applicant: SKYWORKS SOLUTIONS, INC., Woburn, MA (US)

(72) Inventors: Tzung-Yin Lee, Costa Mesa, CA (US); Aniruddha B. Joshi, Irvine, CA (US); David Scott Whitefield, Andover, MA (US); Maureen Rosenberg Brongo, Ladera Ranch, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/182,609

(22) Filed: Nov. 7, 2018

(65) Prior Publication Data

US 2019/0074300 A1    Mar. 7, 2019

Related U.S. Application Data

(63) Continuation of application No. 15/444,153, filed on Feb. 27, 2017, now Pat. No. 10,153,306.

(Continued)

(51) Int. Cl.
| | |
|---|---|
| *H01L 27/12* | (2006.01) |
| *H01L 29/423* | (2006.01) |
| *H01L 23/66* | (2006.01) |
| *H01L 29/786* | (2006.01) |
| *H01L 21/84* | (2006.01) |
| *H01L 29/06* | (2006.01) |

(Continued)

(52) U.S. Cl.
CPC ............ *H01L 27/124* (2013.01); *H01L 21/84* (2013.01); *H01L 23/66* (2013.01); *H01L 27/1203* (2013.01); *H01L 27/1222* (2013.01); *H01L 27/1255* (2013.01); *H01L 27/1259* (2013.01); *H01L 29/0696* (2013.01); *H01L 29/1087* (2013.01); *H01L 29/41733* (2013.01); *H01L 29/4238* (2013.01); *H01L 29/78615* (2013.01); *H01L 29/78618* (2013.01); *H01L 2223/6666* (2013.01); *H01L 2224/05554* (2013.01); *H01L 2224/48091* (2013.01); *H01L 2224/48227* (2013.01); *H01L 2224/49171* (2013.01); *H01L 2924/181* (2013.01)

(58) Field of Classification Search
None
See application file for complete search history.

(56) References Cited

U.S. PATENT DOCUMENTS 5,859,456 A * 1/1999 Efland ............... H01L 29/41758
257/211
8,754,496 B2 * 6/2014 Tserng ............... H01L 29/7787
257/194

(Continued)

*Primary Examiner* — Zandra V Smith
*Assistant Examiner* — Lawrence C Tynes, Jr.
(74) *Attorney, Agent, or Firm* — Chang & Hale LLP

(57) ABSTRACT

A transistor device includes a plurality of drain fingers that are elongate in a first dimension, a plurality of source fingers that are elongate in the first dimension and interleaved with the plurality of drain fingers, one or more drain contact bars extending over a first set of the plurality of drain fingers and a first set of the plurality of source fingers in a second dimension that is orthogonal to the first dimension, and one or more source contact bars extending over a second set of the plurality of drain fingers and a second set of the plurality of source fingers in the second dimension.

14 Claims, 17 Drawing Sheets

Related U.S. Application Data

(60) Provisional application No. 62/301,047, filed on Feb. 29, 2016.

(51) Int. Cl.
*H01L 29/417* (2006.01)
*H01L 29/10* (2006.01)

(56) References Cited

U.S. PATENT DOCUMENTS

| | | | | |
|---|---|---|---|---|
| 2002/0140024 A1* | 10/2002 | Aoki | ............... | H01L 29/0692 257/327 |
| 2003/0102494 A1* | 6/2003 | Akamine | ............ | H01L 27/0207 257/202 |
| 2004/0222854 A1* | 11/2004 | Goto | ................ | H01L 21/265 330/295 |
| 2007/0228424 A1* | 10/2007 | Igarashi | ............. | H01L 27/0605 257/256 |
| 2008/0094141 A1* | 4/2008 | Gotou | ................ | H03F 3/604 330/295 |
| 2010/0259321 A1* | 10/2010 | Tserng | ............... | H01L 29/404 327/581 |
| 2012/0049952 A1* | 3/2012 | Ng | ....................... | H03F 1/42 330/126 |
| 2012/0267795 A1* | 10/2012 | Shimura | ............ | H01L 23/4821 257/776 |
| 2012/0319758 A1* | 12/2012 | Kobayashi | ......... | H03K 17/567 327/432 |
| 2013/0032817 A1* | 2/2013 | Miwa | ................... | H01L 23/647 257/76 |
| 2015/0129965 A1* | 5/2015 | Roy | ..................... | H01L 27/1203 257/347 |
| 2016/0232866 A1* | 8/2016 | Cho | ..................... | G09G 3/3677 |
| 2017/0069742 A1* | 3/2017 | Roberts | ............. | H01L 21/266 |
| 2017/0069744 A1* | 3/2017 | Roberts | ............. | H01L 29/0623 |
| 2017/0069745 A1* | 3/2017 | Linthicum | ......... | H01L 29/32 |
| 2017/0069746 A1* | 3/2017 | Roberts | ............. | H01L 29/7783 |

* cited by examiner

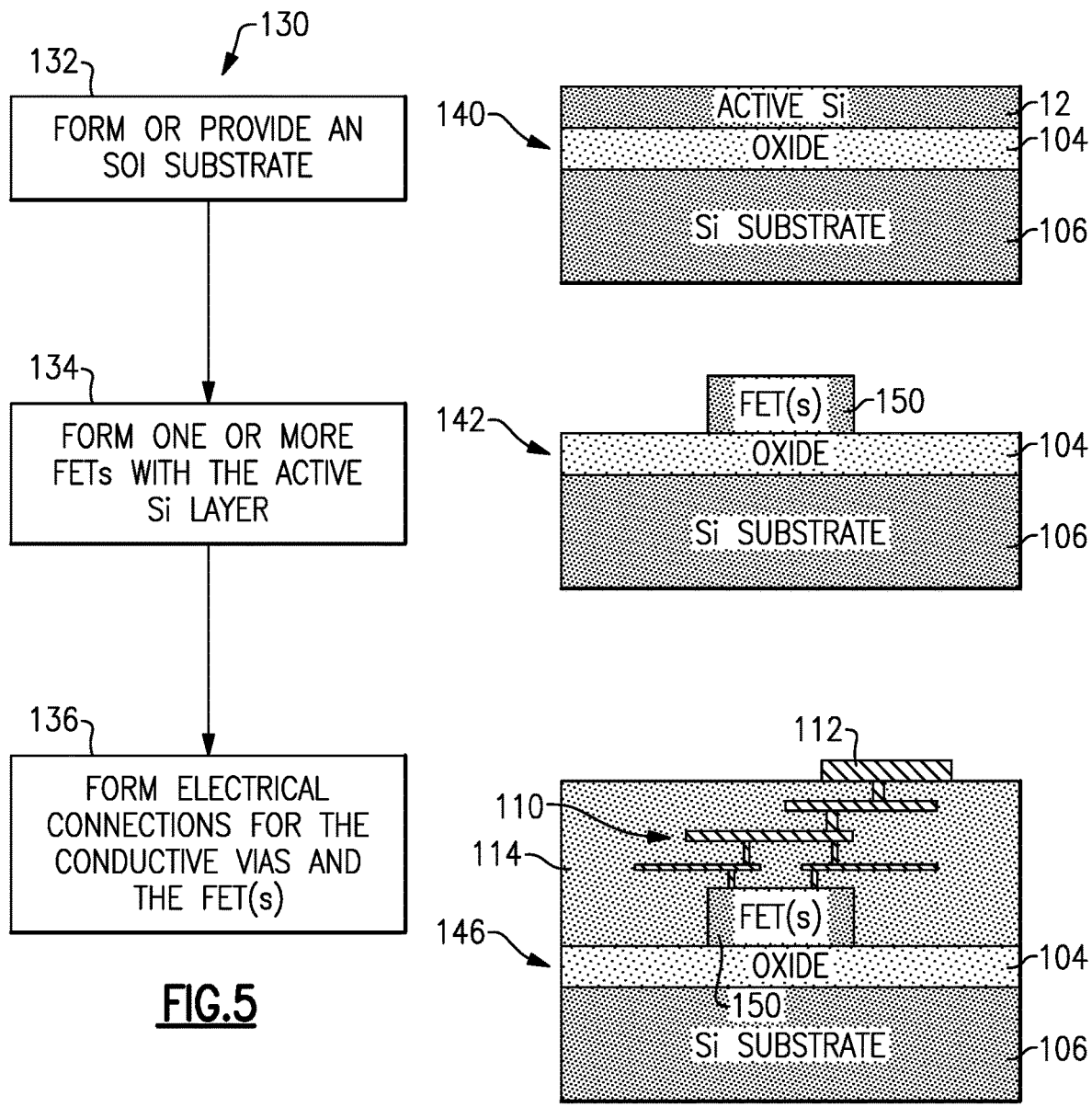

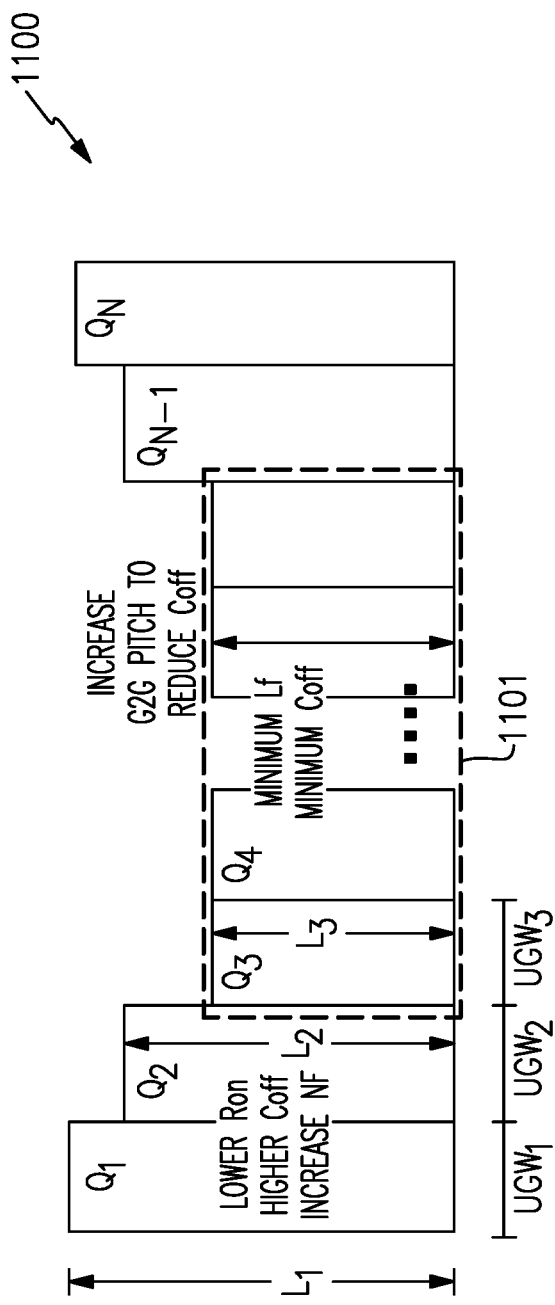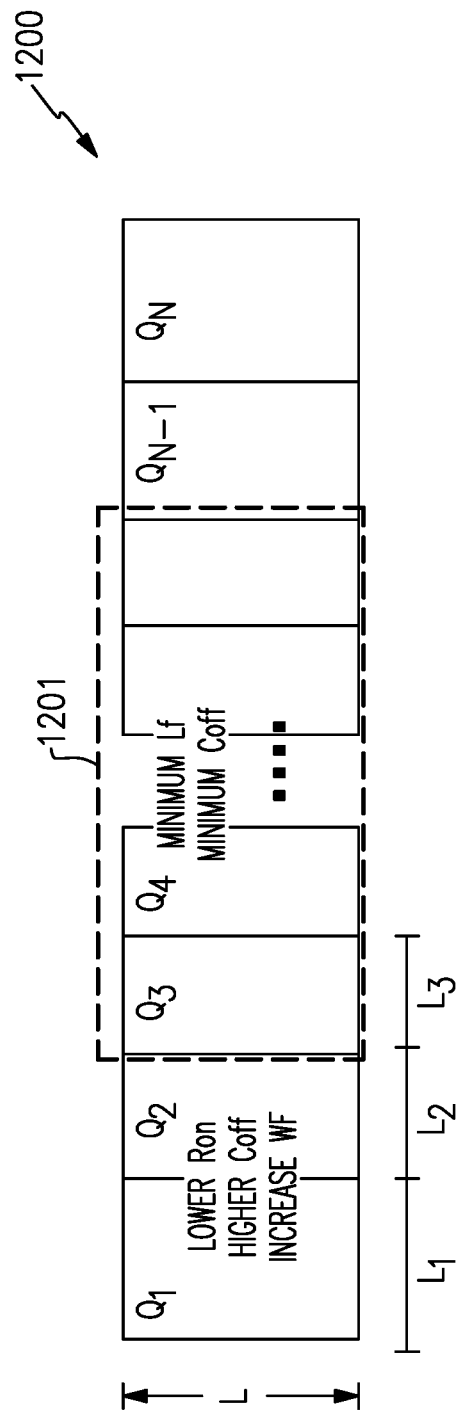

ORTHOGONAL TRANSISTOR LAYOUTS

CROSS-REFERENCE TO RELATED APPLICATION(S)

This application is a continuation of U.S. patent application Ser. No. 15/444,153, filed Feb. 27, 2017, and entitled TRANSISTOR LAYOUT WITH LOW ASPECT RATIO, which claims priority to U.S. Provisional Application No. 62/301,047, filed Feb. 29, 2016, and entitled TRANSISTOR LAYOUT WITH LOW ASPECT RATIO, the disclosure of which is hereby incorporated by reference in its entirety.

BACKGROUND

Field

The present disclosure generally relates to the field of electronics, and more particularly, to radio-frequency (RF) modules and devices.

Description of Related Art

In electronics applications, transistor devices can be utilized for various purposes, such as for routing and/or processing radio-frequency signals in, for example, wireless communication devices.

SUMMARY

In some implementations, the present disclosure relates to a radio-frequency device comprising a semiconductor substrate, a first field-effect transistor disposed on the substrate, the first field-effect transistor having a first plurality of drain fingers, and a second field-effect transistor connected in series with the first field-effect transistor along a first dimension, the second field-effect transistor having a second plurality of drain fingers that extent in a second dimension that is orthogonal with respect to the first dimension.

In certain embodiments, the second plurality of drain fingers includes more fingers than the first plurality of drain fingers. The first field-effect transistor may have a length in the second dimension that is substantially equal to a length of the second field-effect transistor in the second dimension. The length of the first field-effect transistor and the length of the second field-effect transistor may both be less than 15 µm. In certain embodiments, the radio-frequency device further comprises one or more drain contact bars extending over the second plurality of drain fingers in the first dimension and contacting one or more of the second plurality of drain fingers. In certain embodiments, the radio-frequency device further comprises a plurality of drain contact bars extending over the second plurality of drain fingers in the first dimension and a plurality of source contact bars extending over source fingers of the second field-effect transistor, the plurality of drain contact bars and the plurality of source contact bars having a mirrored configuration with respect to the second dimension. The radio-frequency device may further comprise a break running across the second plurality of drain fingers in the first dimension, the break providing a body contact for the second field-effect transistor.

In some implementations, the present disclosure relates to a method for fabricating a radio-frequency device. The method comprises providing a semiconductor substrate, forming a first field-effect transistor over the semiconductor substrate, the first field-effect transistor having a first plurality of drain fingers, and forming a second field-effect transistor connected in series with the first field-effect transistor along a first dimension, the second field-effect transistor having a second plurality of drain fingers that extent in a second dimension that is orthogonal with respect to the first dimension.

In certain embodiments, the second plurality of drain fingers includes more fingers than the first plurality of drain fingers. The first field-effect transistor may have a length in the second dimension that is substantially equal to a length of the second field-effect transistor in the second dimension. The length of the first field-effect transistor and the length of the second field-effect transistor may both be less than 15 µm. In certain embodiments, the method further comprises forming one or more drain contact bars extending over the second plurality of drain fingers in the first dimension and contacting one or more of the second plurality of drain fingers. In certain embodiments, the method further comprises forming a plurality of drain contact bars extending over the second plurality of drain fingers in the first dimension and a plurality of source contact bars extending over source fingers of the second field-effect transistor, the plurality of drain contact bars and the plurality of source contact bars having a mirrored configuration with respect to the second dimension. In certain embodiments, the method further comprises forming a break running across the second plurality of drain fingers in the first dimension, the break providing a body contact for the second field-effect transistor.

In some implementations, the present disclosure relates to a radio-frequency module comprising a packaging substrate configured to receive a plurality of devices, and a transistor stack mounted on the packaging substrate, the transistor stack including a first field-effect transistor disposed on the substrate, the first field-effect transistor having a first plurality of drain fingers, and a second field-effect transistor disposed on the substrate in a series connection with the first field-effect transistor along a first dimension, the second field-effect transistor having a second plurality of drain fingers that extent in a second dimension that is orthogonal with respect to the first dimension.

The second plurality of gate fingers may include more fingers than the first plurality of gate fingers. In certain embodiments, the first field-effect transistor has a length in the second dimension that is substantially equal to a length of the second field-effect transistor in the second dimension. The length of the first field-effect transistor and the length of the second field-effect transistor may both be less than 15 µm. In certain embodiments, the radio-frequency module further comprises one or more drain contact bars extending over the second plurality of drain fingers in the first dimension and contacting one or more of the second plurality of drain fingers. The radio-frequency module may further comprise a plurality of drain contact bars extending over the second plurality of drain fingers in the first dimension and a plurality of source contact bars extending over source fingers of the second field-effect transistor, the plurality of drain contact bars and the plurality of source contact bars having a mirrored configuration with respect to the second dimension.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIG. 5 shows a process that can be implemented to facilitate fabrication of an SOI FET device having one or more features as described herein.

FIG. 6 shows examples of various stages of the fabrication process of FIG. 5.

FIG. 11 illustrates a layout for a transistor stack including a plurality of series-connected transistors according to one or more embodiments.

FIG. 12 provides an alternate transistor stack layout according to certain embodiments disclosed herein.

DESCRIPTION

Figure 1:
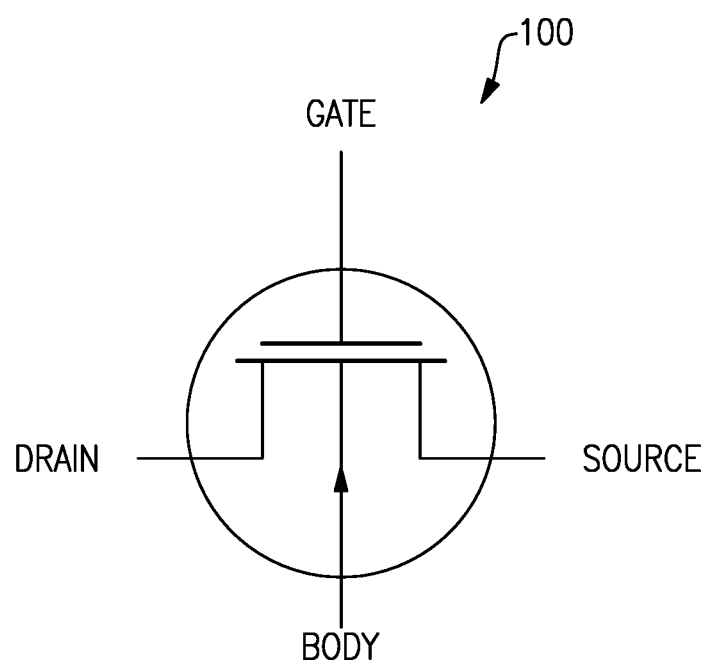
FIG. 1 shows a terminal representation of an SOI FET according to one or more embodiments.

The headings provided herein, if any, are for convenience only and do not necessarily affect the scope or meaning of the claimed invention.

Certain embodiments disclosed herein provide for performance and/or size improvement in transistor stacks using modified transistor finger and/or contact layout, such as in high-performance switch devices/modules. While certain transistor stacks used in switch devices/modules may utilize transistor layouts presenting relatively high aspect ratios, certain embodiments disclosed herein provide for transistor layouts that provide different unit gate widths for different transistors in a transistor stack without requiring increased aspect ratio to accommodate transistor(s) with longer gate width.

ON-resistance ($R_{on}$) in certain transistor devices, such as transistor stacks of radio frequency (RF) switches, may increase with increased unit gate width (UGW). Such increase in $R_{on}$ may be due at least in part to parasitic inductances associated with metal interconnection and/or current crowding effects that may be associated with relatively long-finger transistors. Therefore, UGW of high performance switch may often be kept within relatively short ranges (e.g., 10-15 μm), which may result in a transistor layout with a relatively high aspect ratio due to at least partially non-rectangular switch layouts which may result in many cases as the number of transistor fingers are increased disproportionately across transistors in a transistor stack.

In some implementations, the present disclosure relates to transistor structures and processes that enable a relatively flexible switch layout using transistors of relatively lower aspect ratios, while still maintaining desired switch performance at high frequencies. For example, transistor layouts disclosed herein may comprise transistor fingers rotated approximately 90 degrees with respect to certain conventional transistor layouts. In certain embodiments, rather than summing the drain and source currents at the side edges of the transistor (with respect to the transistor orientation used predominately in the figures associated herewith), the drain and source current sum bars are extended into the transistor.

Principles and concepts disclosed herein may advantageously be implemented in connection with Silicon-on-Insulator (SOI) processes. Although certain embodiments are disclosed herein in the context of SOI technologies, it should be understood that the principles disclosed herein may be applicable to other transistor technologies as well. SOI process technology is utilized in many radio-frequency (RF) circuits, including, for example, those involving high performance, low loss, high linearity switches. In such RF switching devices, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

An SOI transistor may be viewed as a 4-terminal field-effect transistor (FET) device with gate, drain, source, and body terminals. FIG. 1 shows an example 4-terminal representation of an SOI FET 100 having nodes associated with a gate, a source, a drain and a body. It will be understood that in some embodiments, the source and the drain nodes can be reversed. Alternatively, an SOI transistor may be viewed as a 5-terminal device, with an addition of a substrate node. Such a substrate node can be biased and/or be coupled one or more other nodes of the transistor to, for example, improve linearity and/or loss performance of the transistor. Various examples related to SOI and/or other semiconductor active and/or passive devices are described herein in greater detail. Although various examples are described in the context of RF switches, it will be understood that one or more features of the present disclosure can also be implemented in other applications involving FETs and/or other semiconductor devices.

Figure 2A:
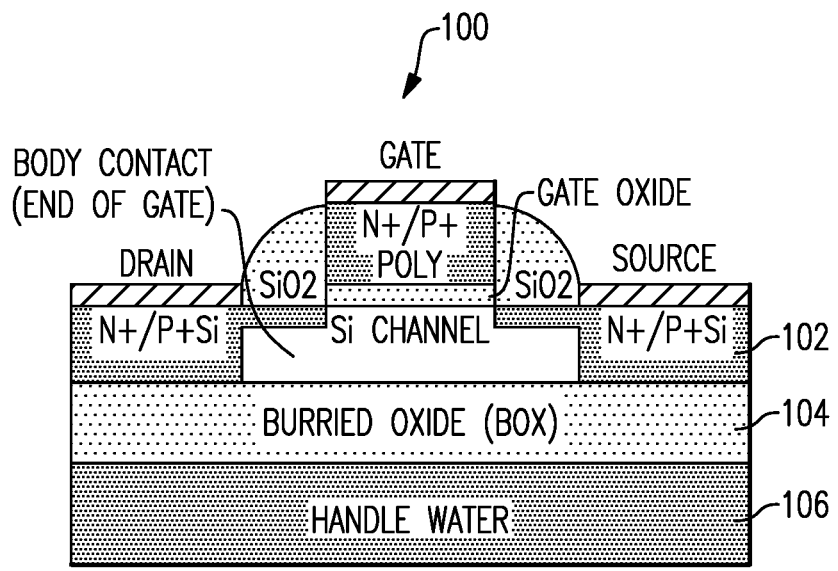
FIGS. 2A and 2B show side sectional and plan views, respectively, of an example SOI FET device according to one or more embodiments.
Figure 2B:
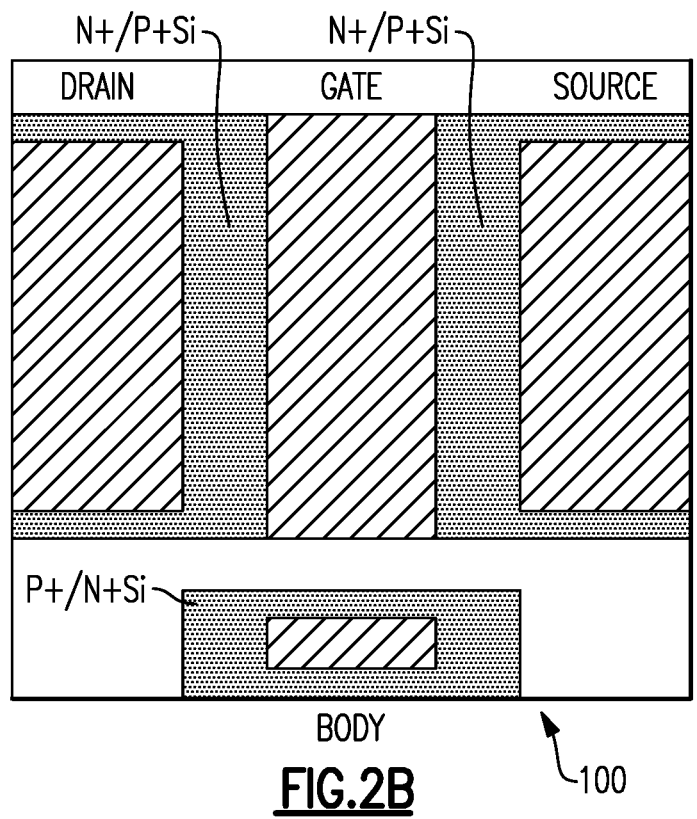

FIGS. 2A and 2B show side sectional and plan views of an example SOI FET 100. The substrate of the FET 100 can be, for example, a silicon substrate associated with a handle wafer 106. Although described in the context of such a handle wafer, it will be understood that the substrate does not necessarily need to have material composition and/or functionality generally associated with a handle wafer. Furthermore, handle wafer and/or other substrate layers like that shown in FIG. 2A may be referred to herein as "bulk substrate," "bulk silicon," "handle substrate," "stabilizing substrate," or the like, and may comprise any suitable or desirable material, depending on the application.

An insulator layer such as a buried oxide (BOX) layer 104 is shown to be formed over the handle wafer 106, and a FET structure is shown to be formed in an active silicon device 102 over the BOX layer 104. In various examples described herein, and as shown in FIGS. 2A and 2B, the FET structure can be configured as an NPN or PNP device.

In the examples of FIGS. 2A and 2B, terminals for the gate, source, drain and body are shown to be configured and provided so as to allow operation of the FET. The BOX layer 104 may be formed on the semiconductor substrate 106. In certain embodiments, the BOX layer 104 can be formed from materials such as silicon dioxide or sapphire. Source and drain may be p-doped (or n-doped) regions whose exposed surfaces generally define rectangles. Source/drain regions can be configured so that source and drain functionalities are reversed. FIGS. 2A and 2B further show that a gate can be formed so as to be positioned between the source and the drain. The example gate is depicted as having a rectangular shape that extends along with the source and the drain. The FET 100 may further include a body contact. Electrically conductive features such as conductive vias and/or trenches may be used to connect to the drain, source, gate and/or body terminals of the FET in certain embodiments. Various examples of how such an electrically conductive feature can be implemented are described herein in greater detail.

Formations of the source and drain regions, and/or the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried oxide layer. Such a configuration can provide, for example, reduced source/drain junction capacitance. To form a body contact for such a configuration, an additional gate region can be provided.

Figure 3:
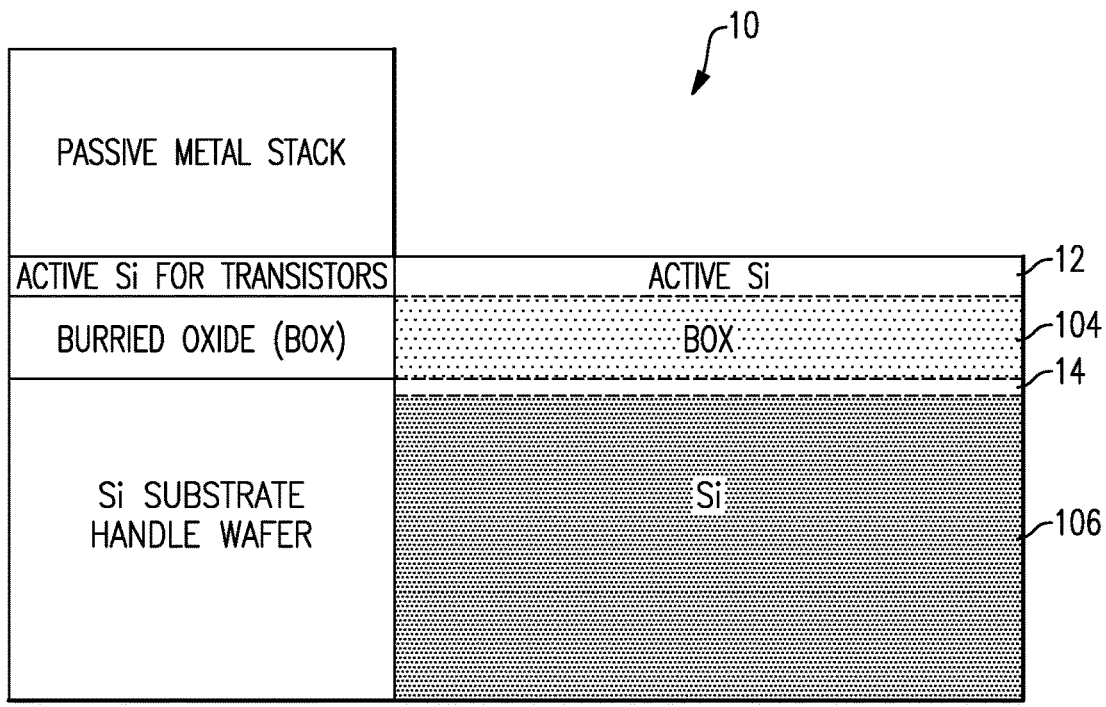
FIG. 3 shows a side sectional view of an SOI substrate that can be utilized to form an SOI FET device according to one or more embodiments.
Figure 4:
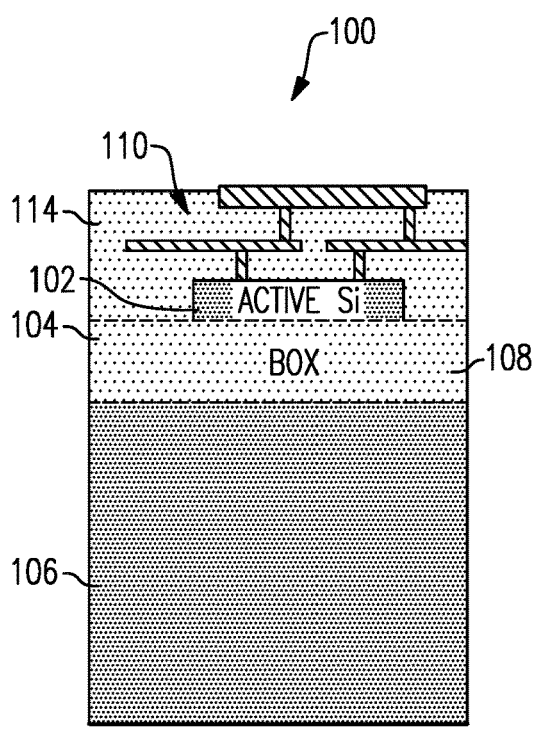
FIG. 4 shows a side sectional view of an SOI FET device according to one or more embodiments.

FIG. 3 shows a side sectional view of an SOI substrate 10 that can be utilized to form an SOI FET 100, as shown in FIG. 4, which may have an electrical connection for a substrate layer 106 (e.g., Si handle layer). In FIG. 3, an insulator layer such as a BOX layer 104 is shown to be formed over the Si handle layer 106. An active Si layer 12 is shown to be formed over the BOX layer 104.

In FIG. 4, an active Si device 102 is shown to be formed from the active Si layer 12 of FIG. 3. The device 100 includes a metal stack 110, which may facilitate electrical contact with the active Si device (e.g., a FET). In some embodiments, such a metal stack 110 can allow for certain conductive features of the FET 100 to be electrically connected to a terminal 112, or other electrically-coupled element. In the example of FIG. 4, a passivation layer 114 can be formed to cover some or all of the connections/metal stack 110 and/or active device 102.

In some embodiments, a trap-rich layer 14 can be implemented between the BOX layer 104 and the Si handle layer 106. In certain embodiments, an electrical connection to the Si handle layer 106 through one or more conductive feature (s) (e.g., substrate contact; not shown in the embodiment of FIG. 4) can eliminate or reduce the need for such a trap-rich layer, which is typically present to control charge at an interface between the BOX layer 104 and the Si handle layer 106, and can involve relatively costly process steps.

FIG. 5 shows a process 130 that can be implemented to fabricate an SOI FET having one or more features as described herein. FIG. 6 shows examples of various stages/structures associated with the various steps of the fabrication process of FIG. 5.

In block 132 of FIG. 5, an SOI substrate can be formed or provided. In state 140 of FIG. 6, such an SOI substrate can include an Si substrate 106 such as an Si handle layer, an oxide layer 104 over the Si substrate 106, and an active Si layer 12 over the oxide layer 104. Such an SOI substrate may or may not have a trap-rich layer between the oxide layer 104 and the Si substrate 106. In block 134 of FIG. 5, one or more FETs can be formed with the active Si layer. In state 142 of FIG. 6, such FET(s) is depicted as 150.

In the example of FIGS. 5 and 6, it will be understood that the various blocks of the process 130 may or may not be performed in the example sequence shown. In some embodiments, conductive feature(s) such as one or more deep trenches can be formed and filled with poly prior to the formation of the FET(s). In some embodiments, such conductive feature(s) can be formed (e.g., cut and filled with a metal such as tungsten (W) after the formation of the FET(s). It will be understood that other variations in sequences associated with the example of FIGS. 5 and 6 can also be implemented.

In block 136 of FIG. 5, electrical connections can be formed for the FET(s). In state 146 of FIG. 6, such electrical connections are depicted as a metallization stack collectively identified by reference number 110. Such a metal stack 110 can electrically connect the FET(s) 150 to one or more terminals 112, or other electrical element or device (e.g., active or passive device). In the example state 146 of FIG. 6, a passivation layer 114 is shown to be formed to cover some or all of the connections/metallization stack 110 and/or FET(s) 150.

Figure 7:
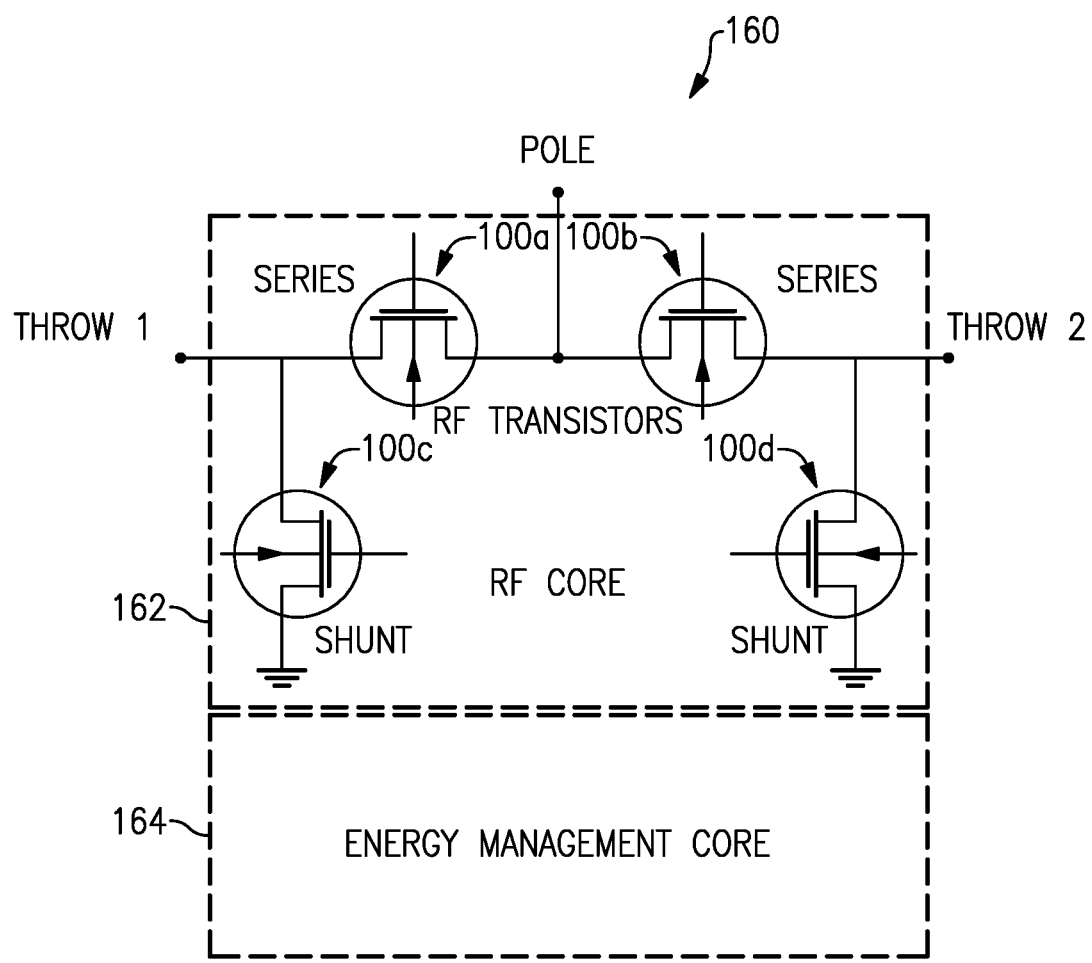
FIG. 7 shows an example of a radio-frequency (RF) switching configuration having an RF core and an energy management (EM) core according to one or more embodiments.

FIG. 7 shows that in some embodiments, SOI FETs having one or more features as described herein can be implemented in RF switching applications. FIG. 7 shows an example of an RF switching configuration 160 having an RF core 162 and an energy management (EM) core 164. Additional details concerning such RF and EM cores are described in U.S. Pub. No. 2014/0009274, titled "Circuits, Devices, Methods and Applications Related to Silicon-on-Insulator Based Radio-Frequency Switches," which is incorporated by reference herein in its entirety. The example RF core 162 of FIG. 7 is shown as a single-pole-double-throw (SPDT) configuration in which series arms of transistors 100a, 100b are arranged between a pole and first and second throws, respectively. Nodes associated with the first and second throws are shown to be coupled to ground through their respective shunt arms of transistors 100c, 100d.

In the example of FIG. 7, the transistors between the pole node and the two throw nodes are depicted as single transistors. In some implementations, such switching functionalities between the pole(s) and the throw(s) can be provided by switch arm segments, where each switch arm segment includes a plurality of transistors such as FETs (see FIG. 10, described below).

Low Aspect Ratio Transistor Layout

Certain embodiments disclosed herein provide systems and processes for implementing transistors having disparate gate lengths in a substantially rectangular form factor, or area. As referenced above, certain transistor stack (e.g., switch) layouts have relatively high aspect ratios in view of increased numbers of transistor fingers extending in a lateral dimension of the transistor stack for one or more transistors of the stack, which may be desirable for various reasons. For example, the ON-resistance (Ron) of certain switch layouts can increase substantially in proportion to increases in the unit gate width (UGW) of transistors at relatively high frequencies, which may be due at least in part to parasitic inductances associated metal interconnections and/or current crowding effects associated with long transistor fingers. Therefore, it may be desirable for UGW in high performance switches to be kept relatively short, such as 10-15 μm, or less. With relatively short UGW, it may be necessary for a transistor to have an increased number of fingers, creating a longer lateral dimension, or footprint, for the transistor. A large lateral transistor dimension may generally be associated with a relatively high aspect ratio for the transistor stack, leading to non-rectangular switch layout form factor in many cases.

In some embodiments, the present disclosure provides transistor layout structures and/or methodologies that enable a flexible switch layout through the use of transistors having lower aspect ratios, while still providing the increased gate length desired for certain of the transistors in a transistor stack and maintaining desirable switch performance at high frequencies. The desire for variation in gate length for different transistors in a transistor stack may be better understood with reference to FIGS. 8-10.

Figure 8:
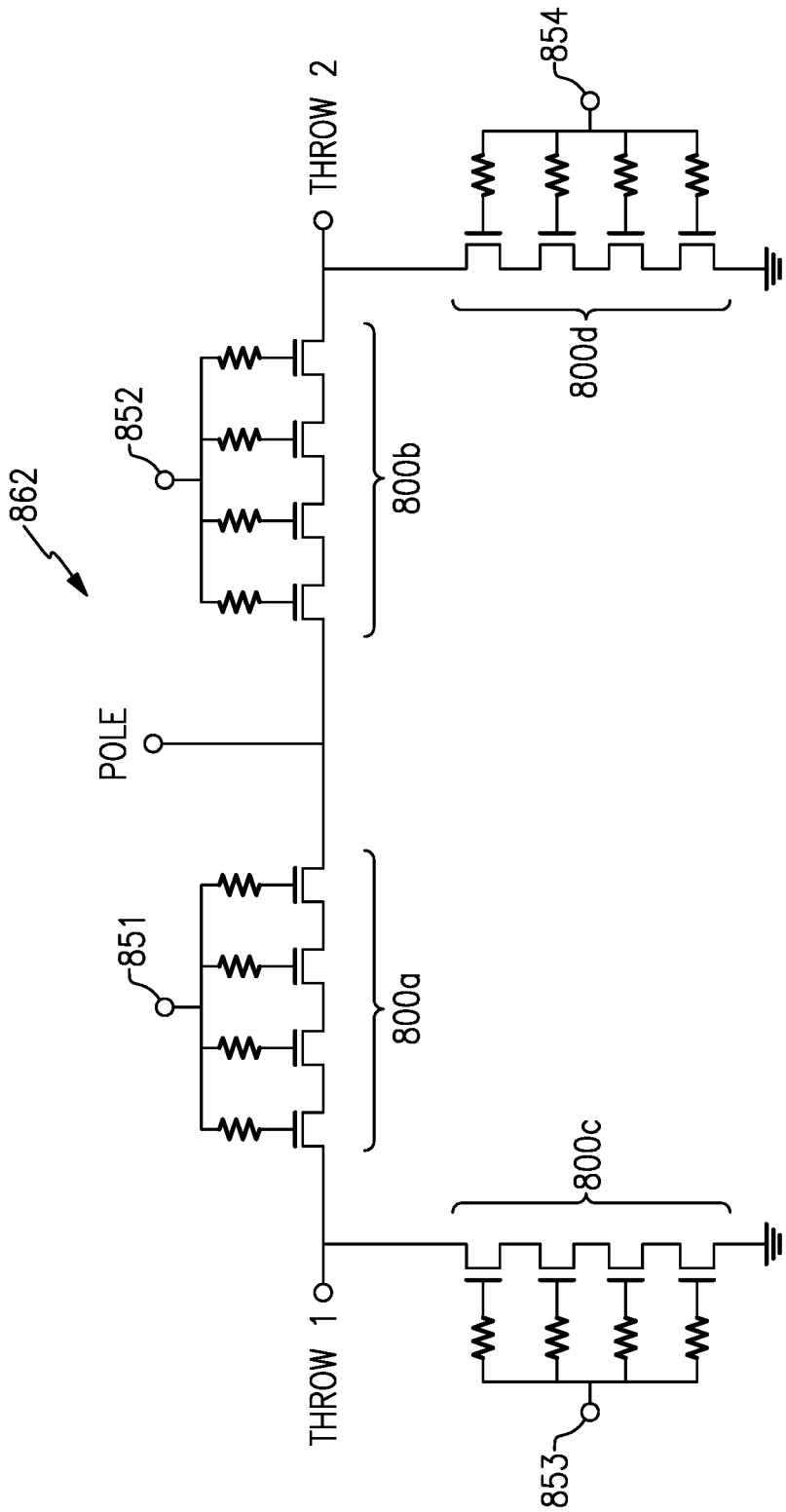
FIG. 8 shows an example of an RF core according to one or more embodiments.

FIG. 8 shows an example of a radio-frequency (RF) core 862 according to one or more embodiments. The circuit 862 is illustrated as a single-pole-double-throw (SPDT) switch. However, one having ordinary skill in the art will appreciate that principles and features disclosed herein may be applicable in other types of circuits or devices.

The RF core 862 includes multiple transistors (e.g., FETs) 800a in a series stack, which may be utilized to provide relatively high-voltage handling and/or high-linearity performance for one or more applications. The transistor stack 800a may include a plurality of transistors so that relatively high voltage may be handled by lower-voltage transistors. That is, the RF voltage present at the pole may be greater than a single transistor may be configured to handle.

FETs and/or other transistor devices may suffer from certain parasitic capacitances due to the underlying substrate (Club) under various conditions. For example, parasitic capacitance between a drain/source well and ground may be present in SOI and/or other processes. Such parasitic capacitance may be affected by various factors, such as transistor area, oxide thickness, bulk substrate type, and/or the like.

Figure 9:
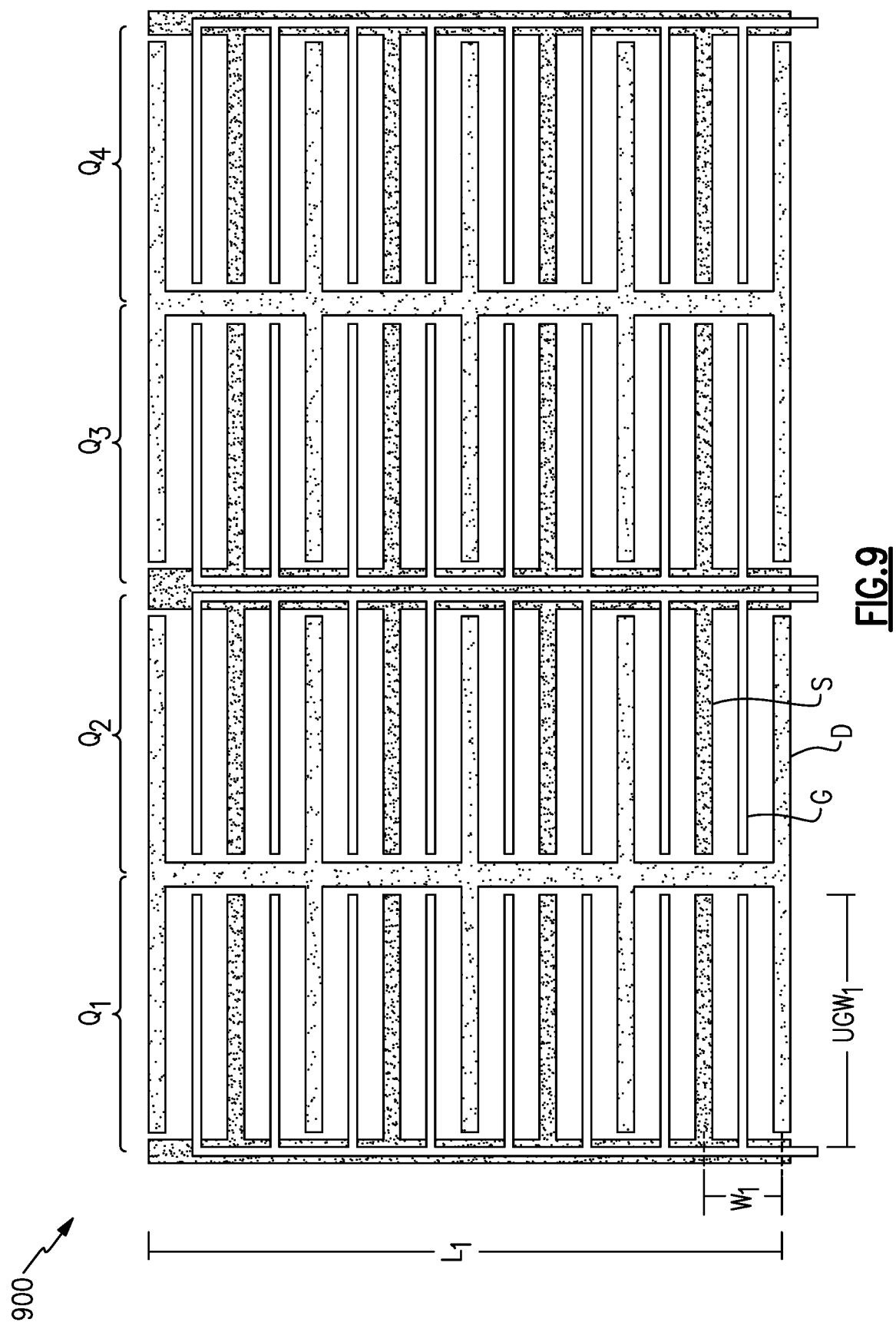
FIG. 9 shows a plan view of an example transistor stack according to one or more embodiments.

FIG. 9 shows a plan view of an example transistor stack 900 according to one or more embodiments. The transistor stack illustrated in FIG. 9 includes four transistors ($Q_1$-$Q_4$), each with a certain number of fingers. However, it should be understood that principles disclosed herein may be applicable to transistor stacks comprising any number of transistors and/or transistors having any number of fingers. In the transistor stack 900, each of the transistors $Q_1$-$Q_4$ may have similar characteristics and/or dimensions and may be designed to achieve relatively-low drain-to-source capacitance. However, in certain embodiments, where relatively minimal total metal-to-metal capacitance is present across the transistors, uneven voltage distribution across the transistor stack may result.

Certain dimensions of the transistor stack 900 and transistors thereof are shown. However, it should be understood that such dimensions are not necessarily drawn to scale and may have any desirable or suitable values and still fall within the scope of the present disclosure. The transistors $Q_1$-$Q_4$ may each have similar dimensions. Therefore, the dimensions of the transistor stack 900 may be understood with reference to $Q_1$, or any of the individual transistors. In certain embodiments, $Q_1$ may have a total area of approximately 2475 μm$^2$ and a total gate width or length of approximately 2 mm. The total gate "width," "length" and/or "transistor periphery" may represent the aggregate length of all of the individual gate fingers of the transistor $Q_1$. The total gate length of the transistor may at least partially determine device performance characteristics, such as ON-resistance, which it may be desirable to maintain at a relatively low level in certain situations. The gate length may be based on a finger count of approximately 133, or other number, with a finger unit gate width (UGW) of approximately 15 μm, or some other value. In certain embodiments, the drain-to-source spacing $W_1$ may be approximately 0.84 μm, or some other value. As explained above, references here in to drain-to-source spacing may further be representative or indicative of gate-to-gate spacing in certain embodiments, as understood by those having ordinary skill in the art.

Each FET of a transistor stack (e.g., series or shunt stack) may have a parasitic capacitance to ground. In certain embodiments, each transistor in a transistor stack may have a substantially similar parasitic capacitance to ground. It may generally not be possible to eliminate or decrease the parasitic capacitance through the box layer of an SOI device to the backside wafer, and so compensation for such capacitance may be desirable in certain processes. In certain embodiments, the parasitic capacitance associated with a first transistor in a stack may have a relatively more detrimental effect on the performance of the associated transistor than the effect of parasitic capacitance on a following transistor in the stack. This may be due in part to the RF voltage present at the gate of the first transistor of the stack (and/or one or more additional transistors at a beginning/end of the stack) being greater than at gates of subsequent transistors that are closer to ground. Therefore, due to the uneven effect of capacitance on the various transistors, uneven voltage division may occur across the stack of transistors. Uneven voltage distribution along the stack can result in degradation of switch performance with respect to, for example, harmonic peaking, compression point and/or intermodulation distortion (IMD). Also, at higher power levels, the first FET(s) may go into breakdown before other FETs, thereby limiting the overall performance of the switch.

It is further noted that uneven voltage distribution across a transistor stack can impact the breakdown voltage performance of the stack. For example, in one implementation, an input voltage of 5V may be provided at an input of a stack having 10 FETs, wherein the voltage drop across each FET is substantially constant (e.g., 0.1 of the input voltage, or 0.5V, for the 10-FET example) such that there is substantially no voltage imbalance within the stack. For example, the FET may be capable of handling at least the example 5V without breaking down. In such implementation, since each FET can handle 5V, and since there is substantially no voltage imbalance, the example stack as a whole may be capable of handling 10 times 5V, or 50V. In a stack with an uneven voltage distribution, one can expect that a FET with the highest relative voltage drop will break down first when the input voltage is increased, thereby yielding a weak link within the stack The effect of uneven voltage distribution may be at least partially mitigated by adding drain-to-source fixed capacitance on one or more (but not all) of the transistors of the stack, such as on one or more transistors that experience relatively higher voltage levels; adding capacitance across drain-to-source may at least partially reduce the drain-to-source voltage for a respective transistor, which may promote more even voltage distribution across all transistors (e.g., FETs) in the stack. Certain systems and methods for compensating for uneven voltage distribution in transistor stacks are disclosed herein, as well as in U.S. Pub. No. 2015/0041917, titled "Field-Effect Transistor Stack Voltage Compensation," filed on Aug. 4, 2014, the disclosure of which is hereby expressly incorporated by reference herein in its entirety.

Figure 10:
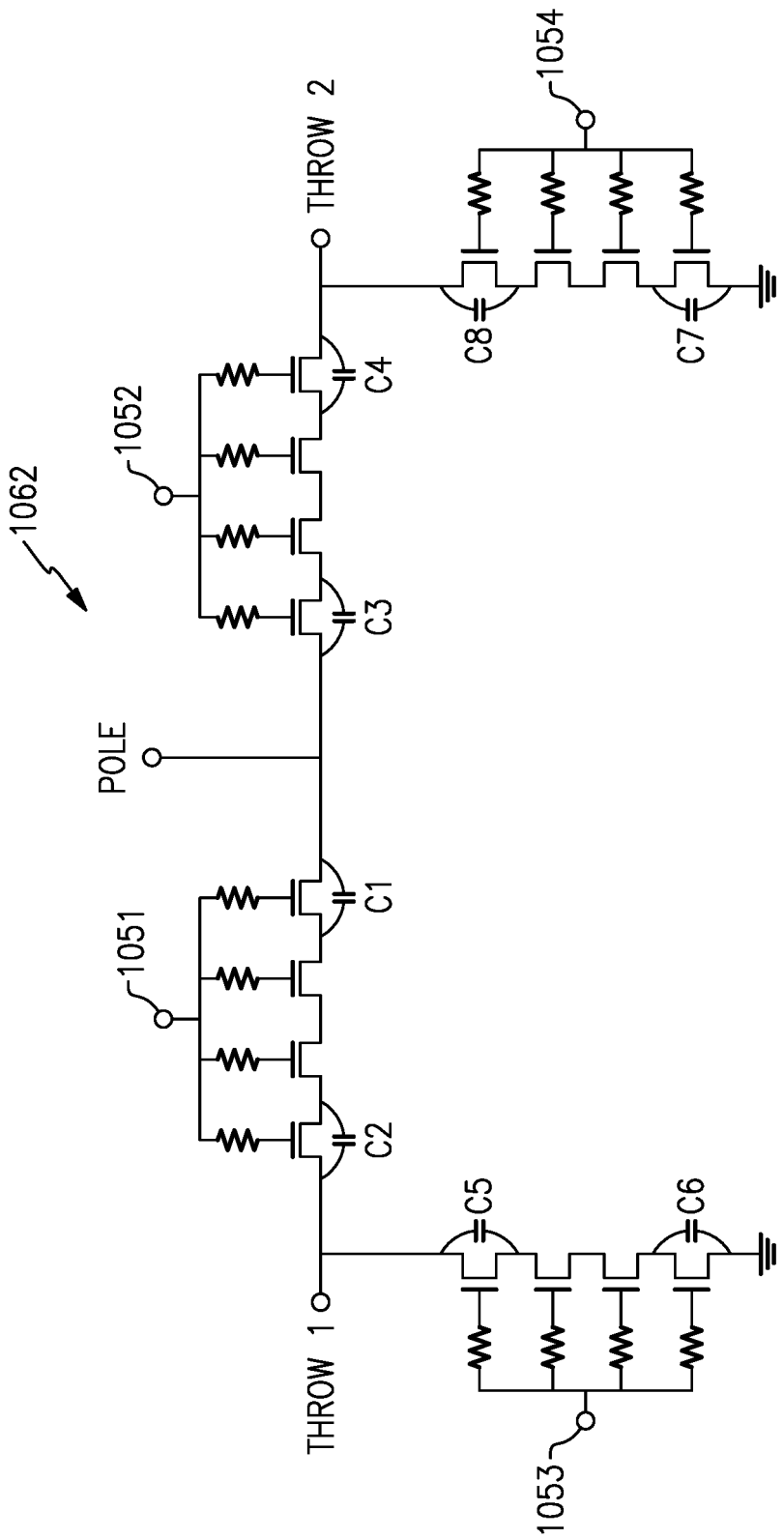
FIG. 10 shows an example of an RF core according to one or more embodiments.

Selective addition of capacitance to one or more transistors of the stack may be achieved in various ways. FIG. 10 shows an example of a radio-frequency (RF) core 1062 according to one or more embodiments, wherein one or more transistors of a series or shunt transistor stack is at least partially bypassed by adding a drain-to-source capacitance. The capacitors ($C_1$, $C_2$, $C_3$, $C_4$, $C_5$, $C_6$, $C_7$, $C_8$) may at least partially compensate for uneven RF voltage distribution across the respective transistor stacks. For example, with respect to the series stack biased at node 1051, the collective RF voltages across the stack may become at least partially more uniform in the presence of the added capacitances $C_1$ and $C_2$. In certain embodiments, adding one or more drain-to-source capacitances may allow for some or all of the transistors of the stack to have similar voltages, which may allow for a relatively higher total voltage-handling and/or linearity performance capability for the stack.

In certain embodiments, a first capacitance of the stack may advantageously be a higher value than capacitance associated with one or more subsequent transistor(s) of the stack. Although the illustrated embodiment of FIG. 10 only shows capacitors associated with the first and last transistors of a stack, it should be understood that any number or selection of transistors of the stack may be at least partially bypassed by added capacitance in certain embodiments. Where only a subset of transistors is associated with added capacitance, such capacitance may advantageously be associated with front-side transistors.

Added capacitance on selected transistors may be accomplished by adding fixed metal-insulator-metal (MIM) (e.g., lumped element MIM capacitor(s)) capacitors to drain and source nodes of the respective transistors, adding additional metal to the respective transistor fingers, thereby providing interdigitated capacitor(s), or by increasing gate length of the transistor(s). Certain embodiments disclosed herein provide for improved performance in transistor stacks through the use of selective increased transistor length, while maintaining a desirable aspect ratio for the transistor stack.

FIG. 11 illustrates a layout for a transistor stack 1100 including a plurality of series-connected transistors ($Q_1$-$Q_N$). The stack 1100 includes transistors having varying OFF-capacitances (and ON-resistances), while maintaining similar unit gate widths ($UGW_1$, $UGW_2$, $UGW_3$), by having increased numbers of fingers for the different transistors ($Q_1$, $Q_2$, $Q_3$), resulting in different lateral dimensions ($L_1$, $L_2$, $L_3$) for the different transistors; additionally or alternatively, metal interconnection along the transistor fingers may be increased. In certain embodiments, UGW for each of the transistors in the stack 1100 may be around 10-15 µm for high performance switch applications. As a result, the layout of the transistor stack 1100 may be increased in the lateral direction to accommodate the length $L_1$ of the first transistor $Q_1$, resulting in a non-rectangular form factor, or aread, (i.e., "dog-bone" layout) with higher aspect ratio. The increased finger count for the first $Q_1$ and second $Q_2$ transistors may provide relatively lower ON-resistance ($R_{on}$), higher OFF-capacitance ($C_{off}$), and/or improved noise figure (NF) for such transistors relative middle transistors 1101 of the stack 1100, which may have a relatively lower finger counts and/or lateral dimension $L_3$. The transistors 1101, relative to the transistors $Q_1$ and/or $Q_2$, may have increased gate-to-gate pitch to provide relatively lower OFF-capacitance ($C_{off}$). Furthermore, the middle transistors 1101 may provide minimum channel length (Lf).

FIG. 12 provides an alternate transistor stack layout according to certain embodiments disclosed herein. The layout for the transistor stack 1200 may provide improved $R_{on}$ and $C_{off}$ for certain, e.g., SOI switch applications. In the layout of FIG. 12, the transistors $Q_1$ and/or $Q_2$ may have decreased $R_{on}$ and increased $C_{off}$ with respect to one or more interior transistors 1201, while maintaining a substantially similar lateral dimension L for each of the transistors of the stack 1200, thereby allowing for a substantially rectangular form factor, or area. Such characteristics may be achieved through the formation of transistors having gate, drain and/or source fingers in an orientation rotated 90 degrees with respect to certain conventional transistor stack layouts. That is, the overall aspect ratio of the stack 1200 may not be substantially greater in view of the modified dimensions of the transistors $Q_1$, $Q_2$, which have increased OFF-capacitance ($C_{off}$) due to the transistor fingers being rotated such that an increase in the number of fingers increases a longitudinal dimension $L_1$, $L_2$ rather than the lateral dimension L, thereby allowing for a substantially rectangular layout. As identified in FIG. 12, the layout 1200 may include a lower number of fingers (NF) and/or increased finger width (WF; e.g., unit gate width) compared to the layout 1100 at least for transistor $Q_1$. The total width of the transistor $Q_1$ may be defined by the number of fingers (NF) times the finger width (WF).

Figure 13:
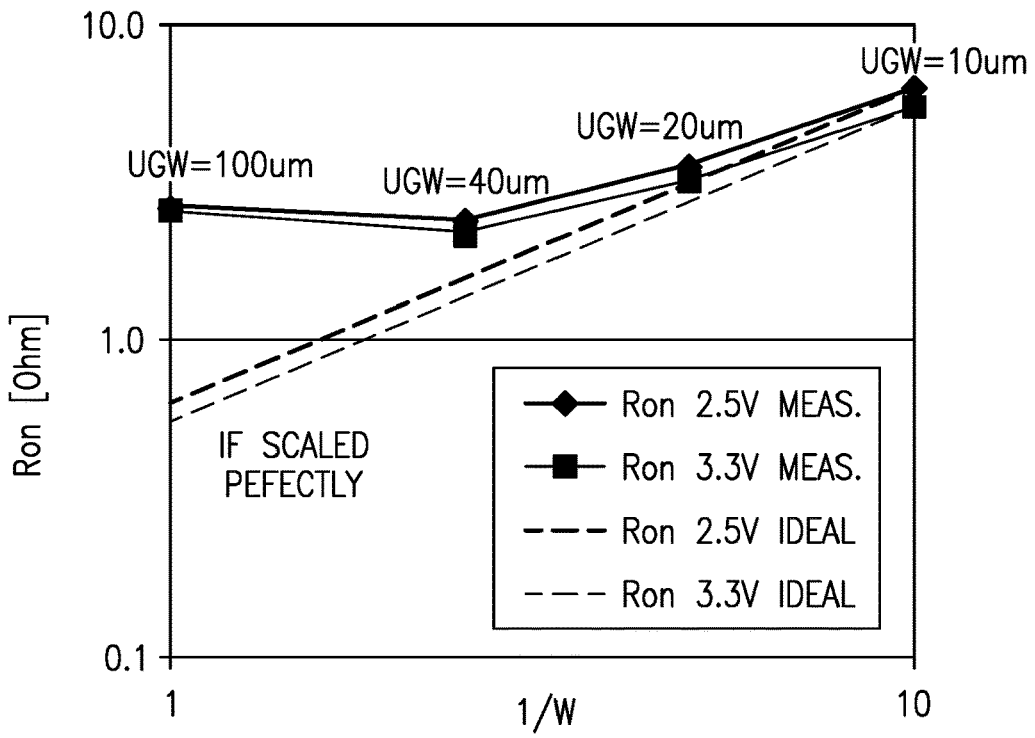
FIGS. 13 and 14 are graphs illustrating a potential relationship between unit gate width of a transistor and ON-resistance according to one or more embodiments.
Figure 14:
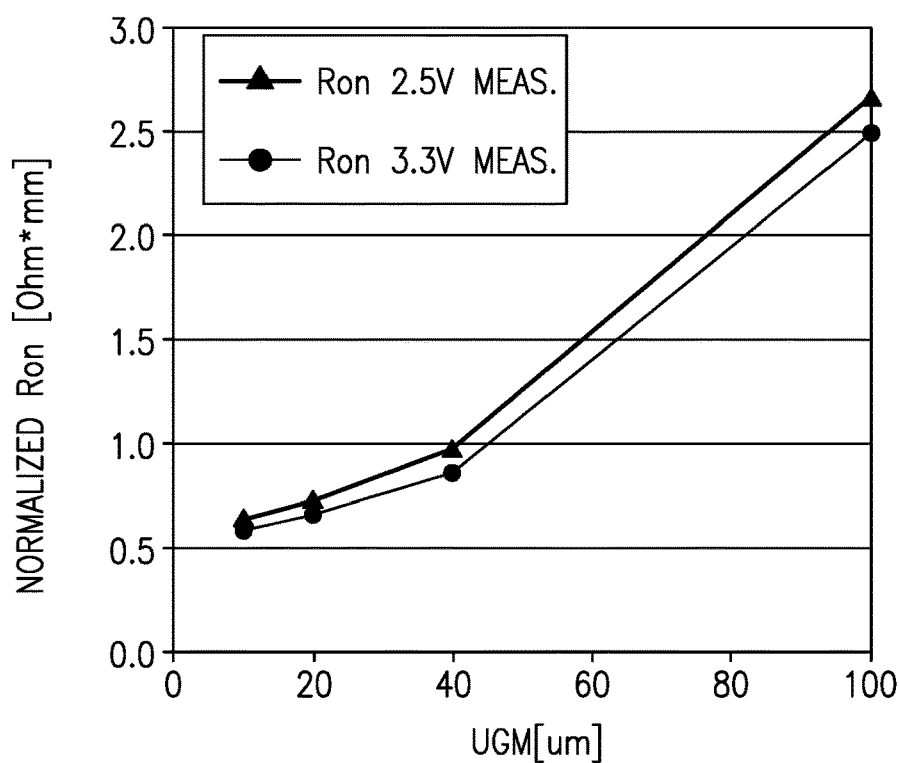

FIGS. 13 and 14 are graphs illustrating a potential relationship between unit gate width (UGW) of a transistor and ON-resistance ($R_{on}$). As shown, relatively high $R_{on}$ may result from use of relatively long UGW. In certain embodiments, current crowding effects may at least partially limit the maximum WF that may be used. In certain embodiments, only the edge portion of the transistor may be fully utilized.

Figure 15:
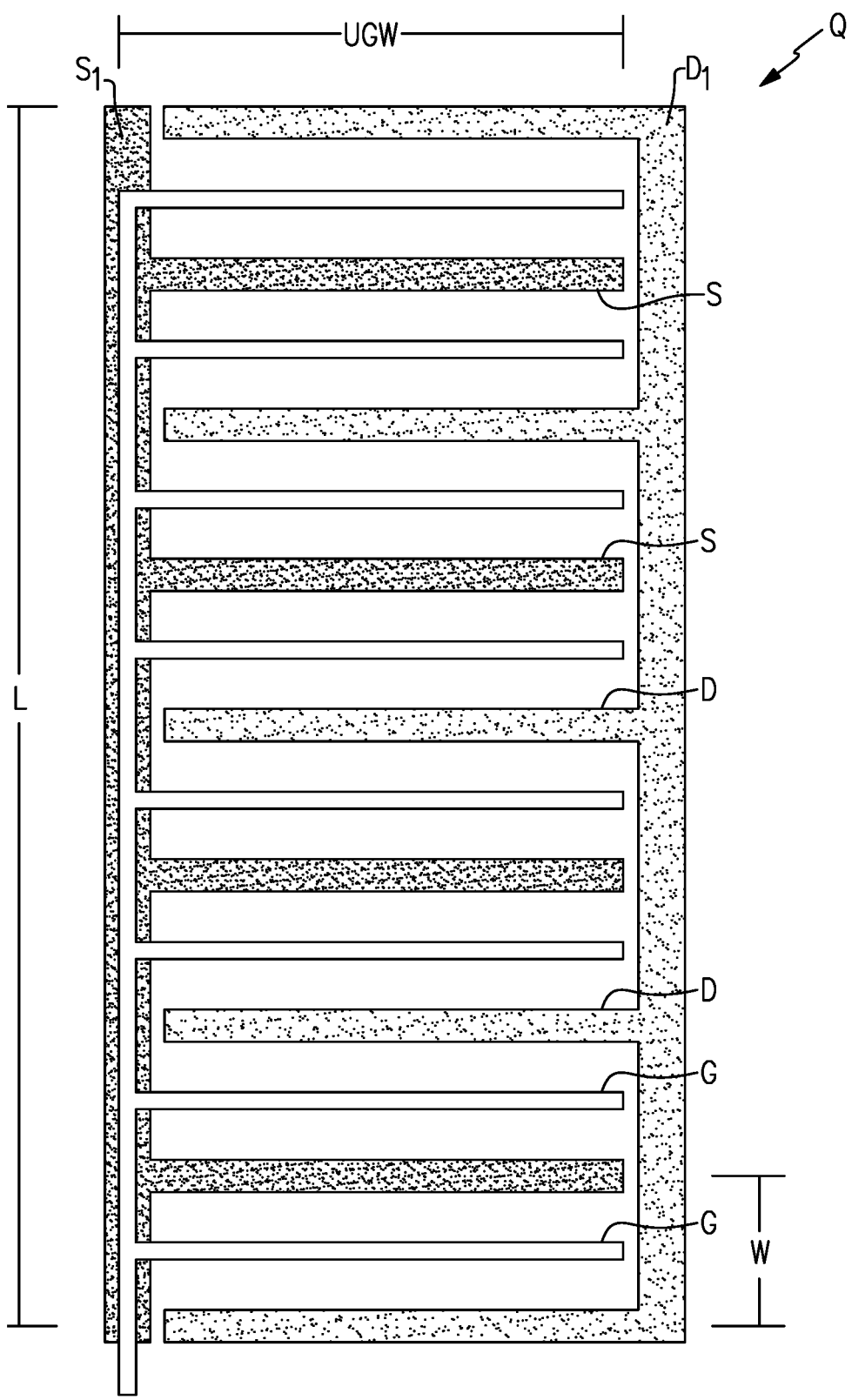
FIG. 15 shows a plan view of an example transistor Q according to one or more embodiments.

FIG. 15 shows a plan view of an example transistor Q according to one or more embodiments. The transistor Q illustrated in FIG. 15 includes eight gate fingers. However, it should be understood that principles disclosed herein may be applicable to transistor stacks comprising any number of fingers. Certain dimensions of the transistor Q are shown. However, it should be understood that such dimensions are not necessarily drawn to scale and may have any desirable or suitable values and still fall within the scope of the present disclosure. The total gate length of the transistor Q may be the aggregate length (UGW) of all of the individual gate fingers of the transistor Q. The total gate length of the transistor may at least partially determine device performance characteristics, such as ON-resistance, which it may be desirable to be relatively high level in certain situations. The gate length UGW of the transistor Q may be approximately 15 µm, or some other value. In certain embodiments, the drain-to-source spacing W may be approximately 0.84 µm, or some other value. As explained above, references here in to drain-to-source spacing may further be representative or indicative of gate-to-gate spacing in certain embodiments, as understood by those having ordinary skill in the art. The transistor includes laterally-arranged interleaved drain fingers (D), source fingers (S) and gate fingers (G).

With a relatively high number of fingers, the transistor Q may have a relatively high ratio of lateral dimension (L) to longitudinal dimension UGW ratio, which may be problematic, as described above, to the extent that the lateral dimension L is greater than that for other transistors connected in series with the transistor Q. The drain (D) and source (S) currents are summed at the side edges, $D_1$, $S_1$, respectively.

Figure 16:
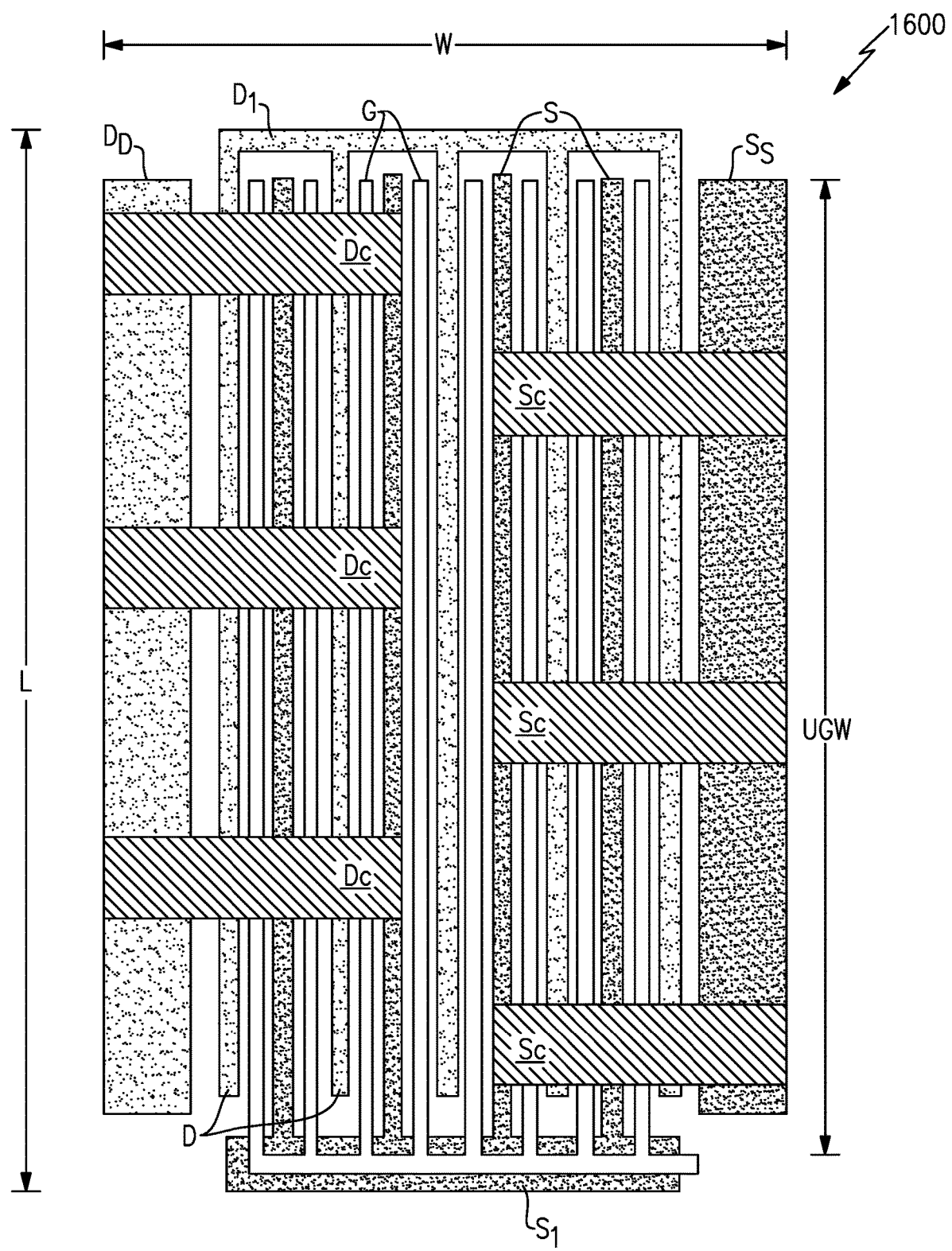
FIG. 16 is a plan view of a transistor device comprising a multi-finger structure rotated 90 degrees as compared to the transistor shown in FIG. 15 according to one or more embodiments.

FIG. 16 is a plan view of a transistor device 1600 comprising a multi-finger structure rotated 90 degrees as compared to the transistor shown in FIG. 15. Rather than summing the drain and source currents at the side edges, as in the diagram of FIG. 15, in the layout of the transistor device 1600, the drain $D_C$ and source $S_C$ current sum bars are extended into the transistor to contact the respective fingers, where they are collected at a lateral channel ($D_D$, $S_S$). The overall lateral dimension L of the device 1600 may be determined by, or proportional to, the unit gate width (UGW) of the transistor fingers, not the number of fingers or gate-to-gate spacing. Therefore, the number of fingers may be increased, thereby possibly increasing the dimension W, while the device 1600 may be designed such that the lateral dimension L is substantially equal to that of any other series-connected transistors, irrespective of the number of fingers of the device 1600.

Because the lateral dimension L may be designed to maintain a substantially rectangular transistor stack layout area, a relatively lower aspect ratio may result when compared to a "dog-bone" layout for transistor stacks having variation in $R_{on}/C_{off}$ characteristics across transistors. Furthermore, because the drain and source currents are summed locally, as shown, the high frequency current crowding effects that may be manifested in relatively large transistors may be at least partially alleviated. In addition, with the drain $D_C$ and source $S_C$ summing bars formed substantially orthogonal to the transistor drain and source fingers, relatively low coupling capacitance may be present with respect to the source and drain metals disposed underneath. In certain embodiments, the drain $D_C$ and source $S_C$ summing bars may be formed of higher-level metals, which further reduce the coupling capacitance to the drain and source metallization, as well as the resistance. In certain embodiments, the drain and source summing bars are maintained at least a few µm apart, therefore introducing relatively little coupling capacitance in between.

Figure 17:
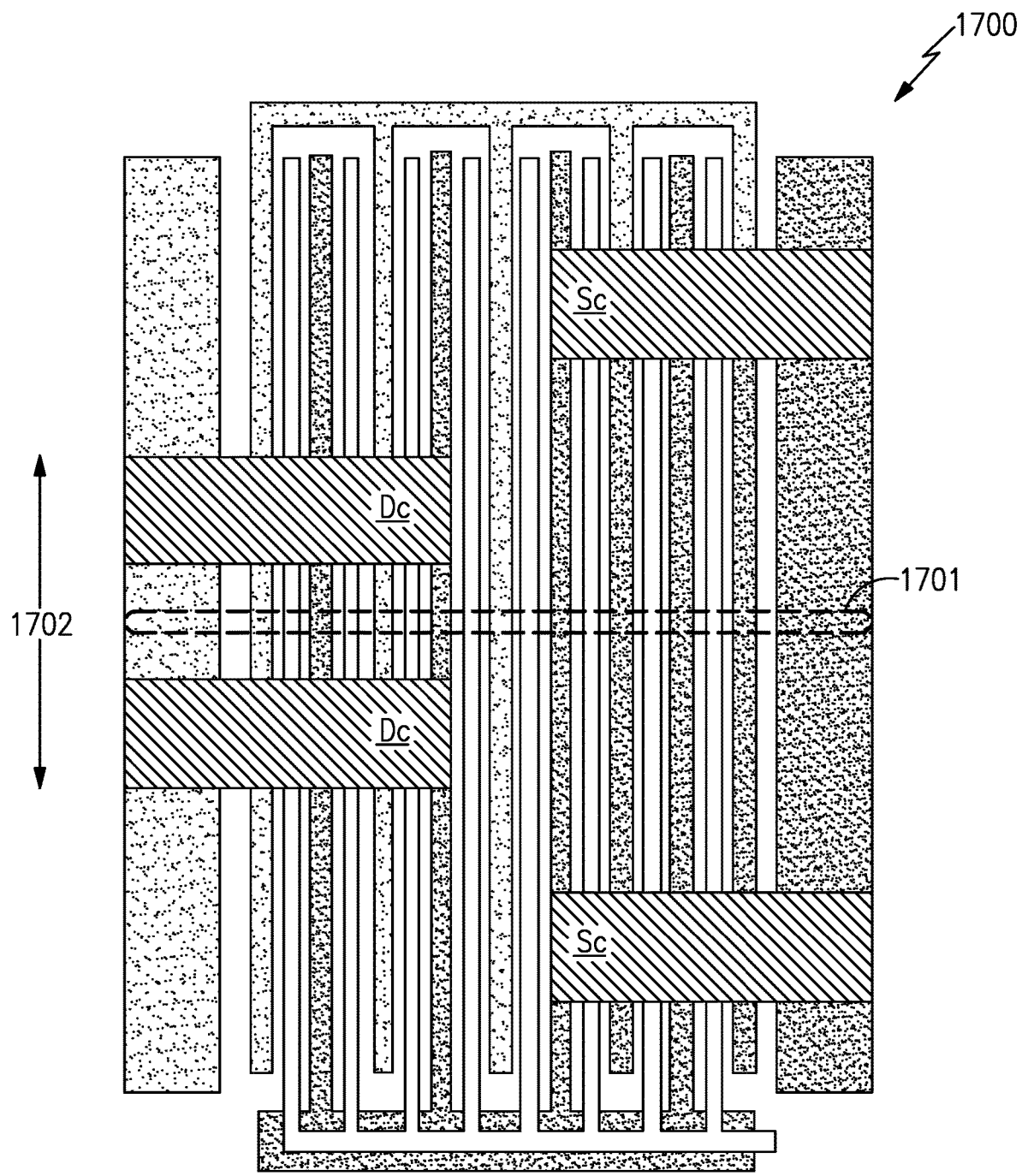
FIG. 17 is a plan view of a transistor device comprising a multi-finger structure rotated 90 degrees as compared to the transistor shown in FIG. 15 according to one or more embodiments.

FIG. 17 is a plan view of a transistor device 1700 comprising a multi-finger structure rotated 90 degrees as compared to the transistor shown in FIG. 15 according to one or more embodiments. The device 1700 includes a break 1701 along the transistor in the lateral direction 1702, which may be implemented to add addition gate or body contact(s), which may promote desired transistor performance in certain embodiments. For example, the transistor layout 1700 may provide increased finger width, and a reduced number of fingers, compared to a transistor having a layout like that shown in FIG. 15 having a similar total gate width. Because increased finger width can negatively impact performance in some configurations, the break 1701 may allow for the recovery of at least some performance by reducing the effective unit width. For example, the break 1701 may comprise a body contact inserted in the identified region. In certain embodiments, the body contact comprises an extrinsic p+ implant (or n+), which may be implemented in the spatial device design. The transistor 1701 may allow for the insertion of one or more breaks due to the presence of multiple source $S_C$ and drain $D_C$ bars. In addition, the device 1700 includes drain $D_C$ and source $S_C$ summing bars that substantially mirror one another across the break 1701 in the lateral direction 1702. For example, moving in the lateral direction (i.e., in the direction of the transistor fingers), a drain summing bar contact $D_C$ may be followed by another drain contact on the drain side before the placement of source contact in the lateral direction 1702, while a source summing bar contact $S_C$ may be followed by another source contact on the source side before the placement of a drain contact in the lateral direction 1702. Mirroring the transistor alternately, as shown in FIG. 17, may provide reduced capacitance between the drain $D_C$ and source $S_C$ summing bar contacts. Where the transistor 1700 is part of a stack of transistors connected in series in the lateral direction 1702, wherein the adjacent series-connected transistor (not shown) substantially mirrors the transistor 1700 such that a source contact $S_C$ of the transistor 1700 is followed by a source contact of the adjacent transistor, a break may be formed or implemented between the source contacts of the adjacent transistors.

Figure 18:
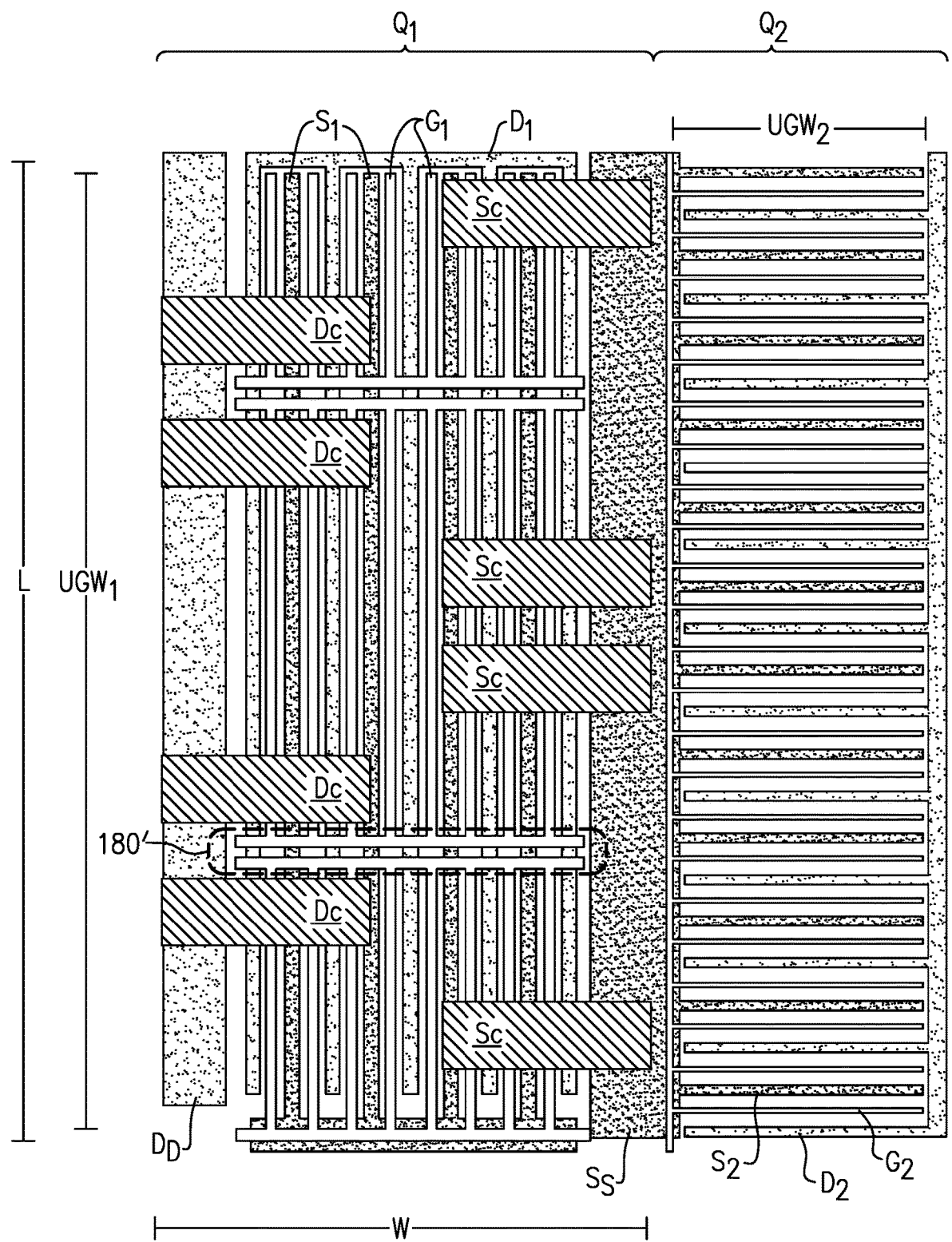
FIG. 18 is a plan view of transistor devices connected in series according to one or more embodiments.

FIG. 18 is a plan view of a transistor device $Q_1$ comprising a multi-finger structure rotated 90 degrees as in FIGS. 16 and 17 connected in series with a transistor $Q_2$ having a traditional layout as in FIG. 15. The transistor $Q_1$ is associated with drain $D_C$ and source $S_C$ current-summing bars that extend into the transistor to contact the respective fingers, where they are collected at a lateral channel ($D_D$, $S_S$). The overall lateral dimension L of the device $Q_1$ may be determined by or proportional to the unit gate width ($UGW_1$) of the transistor fingers, and not necessarily the number of fingers or gate-to-gate spacing. Therefore, the number of fingers may be increased, thereby possibly increasing the dimension W, while the device $Q_1$ may be designed such that the lateral dimension L is substantially equal to that of the series-connected transistor $Q_2$ that has a traditional layout, irrespective of the number of fingers of the device $Q_1$.

The drain $D_C$ and source $S_C$ summing bars of the transistor $Q_1$ may be substantially parallel to the drain $D_2$, source $S_2$, and/or gate $G_2$ fingers of the transistor $Q_2$. However, the drain $D_1$, source $S_1$, and/or gate $G_1$ fingers of the transistor $Q_1$ are perpendicular or orthogonal to the drain $D_2$, source $S_2$, and/or gate $G_2$ fingers of the series-connected transistor $Q_2$. The transistor $Q_1$ may further comprise one or more breaks, such as the illustrated break 1801, which runs perpendicular or orthogonal to the elongated drain, source, and/or gate fingers of the transistor $Q_1$. In certain embodiments, the gate fingers of the transistor $Q_1$ do not continue across the break 1801 but may be summed from either side of the break, as shown. Although certain drain, source, and/or gate fingers or regions are shows as having certain lengths, connections, and/or positions, it should be understood that the various fingers or regions may be connected, or summed, in any suitable or desirable way, and certain connections are not illustrated for clarity purposes. Furthermore, although a certain number of fingers is illustrated for each of the transistors of FIG. 18, it should be understood that principles disclosed herein may be applicable to transistors comprising any number of fingers. Certain dimensions of the transistors $Q_1$, $Q_2$ are shown. However, it should be understood that such dimensions are not necessarily drawn to scale and may have any desirable or suitable values and still fall within the scope of the present disclosure.

Examples of Implementations in Products

Figure 19A:
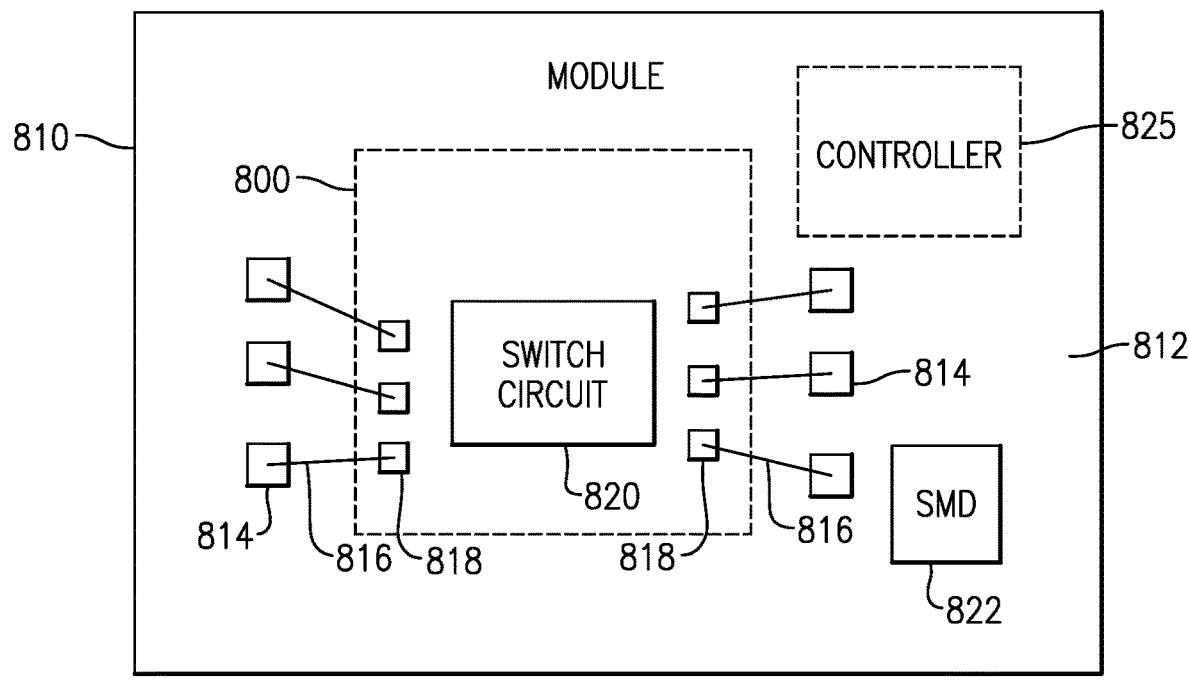
FIGS. 19A and 19B show plan and side views, respectively, of a packaged module having one or more features as described herein.

In some embodiments, one or more die having one or more features described herein can be implemented in a packaged module. An example of such a module is shown in FIG. 19A (plan view) and 19B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having integrated active and passive devices, as described herein, is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 19B:
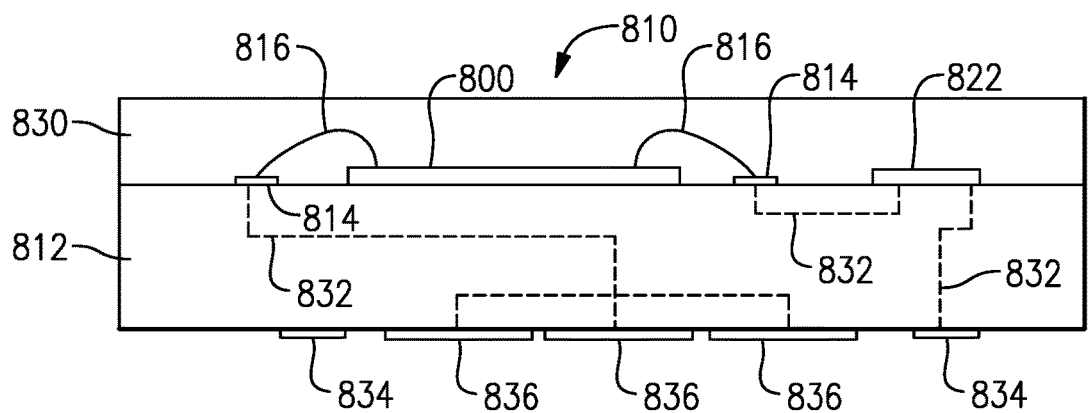
Figure 20:
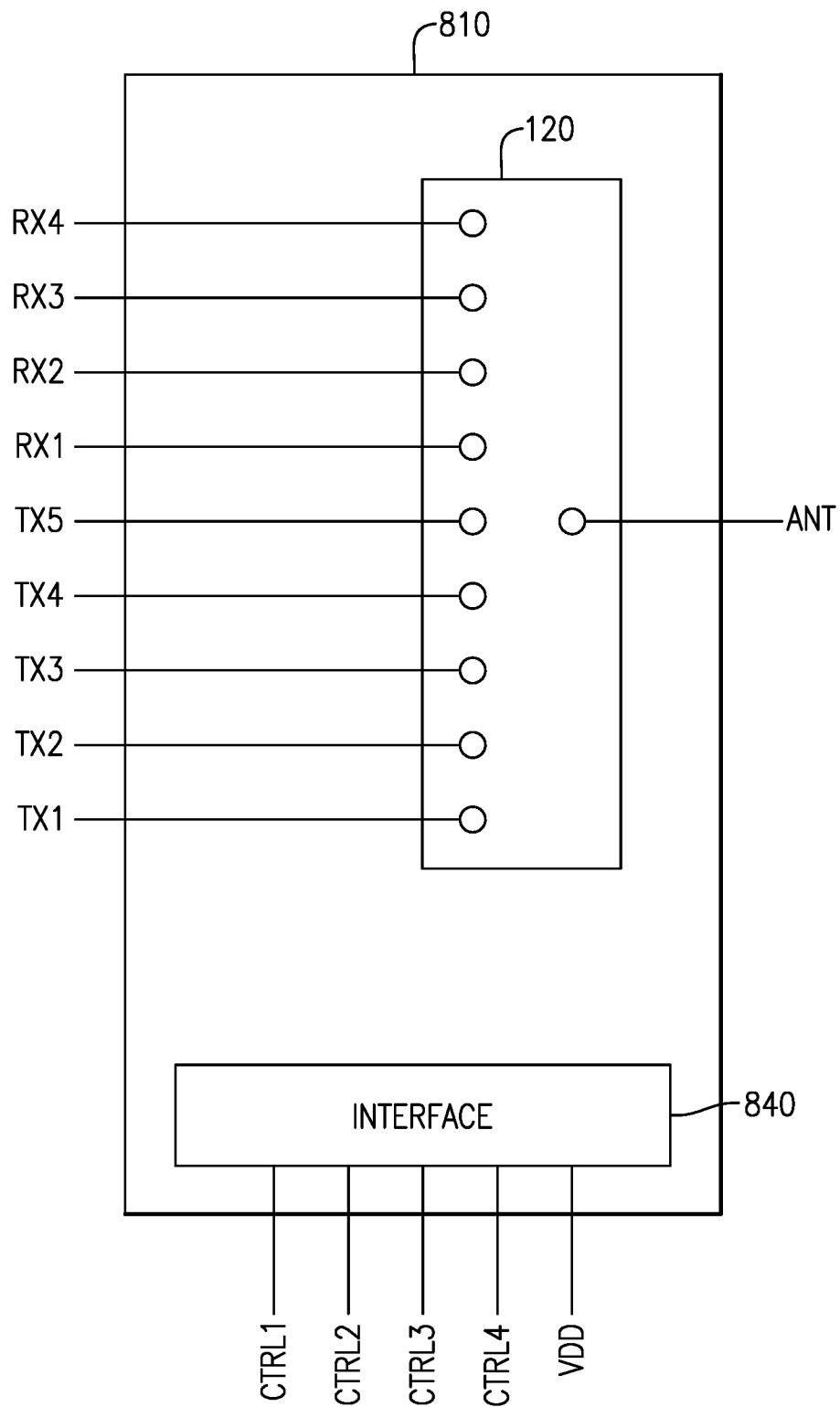
FIG. 20 shows a schematic diagram of an example switching configuration that can be implemented in a module according to one or more embodiments.

FIG. 20 shows a schematic diagram of an example switching configuration that can be implemented in the module 810 described in reference to FIGS. 19A and 19B. Although described in the context of a switch circuit. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices. The module 810 can further include an interface for receiving power (e.g., supply voltage $V_{DD}$) and control signals to facilitate operation of the switch circuit 120. The switch 120 may comprise one or more transistors having rotated transistor fingers to provide low aspect ratio layout(s) as described herein.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 21:
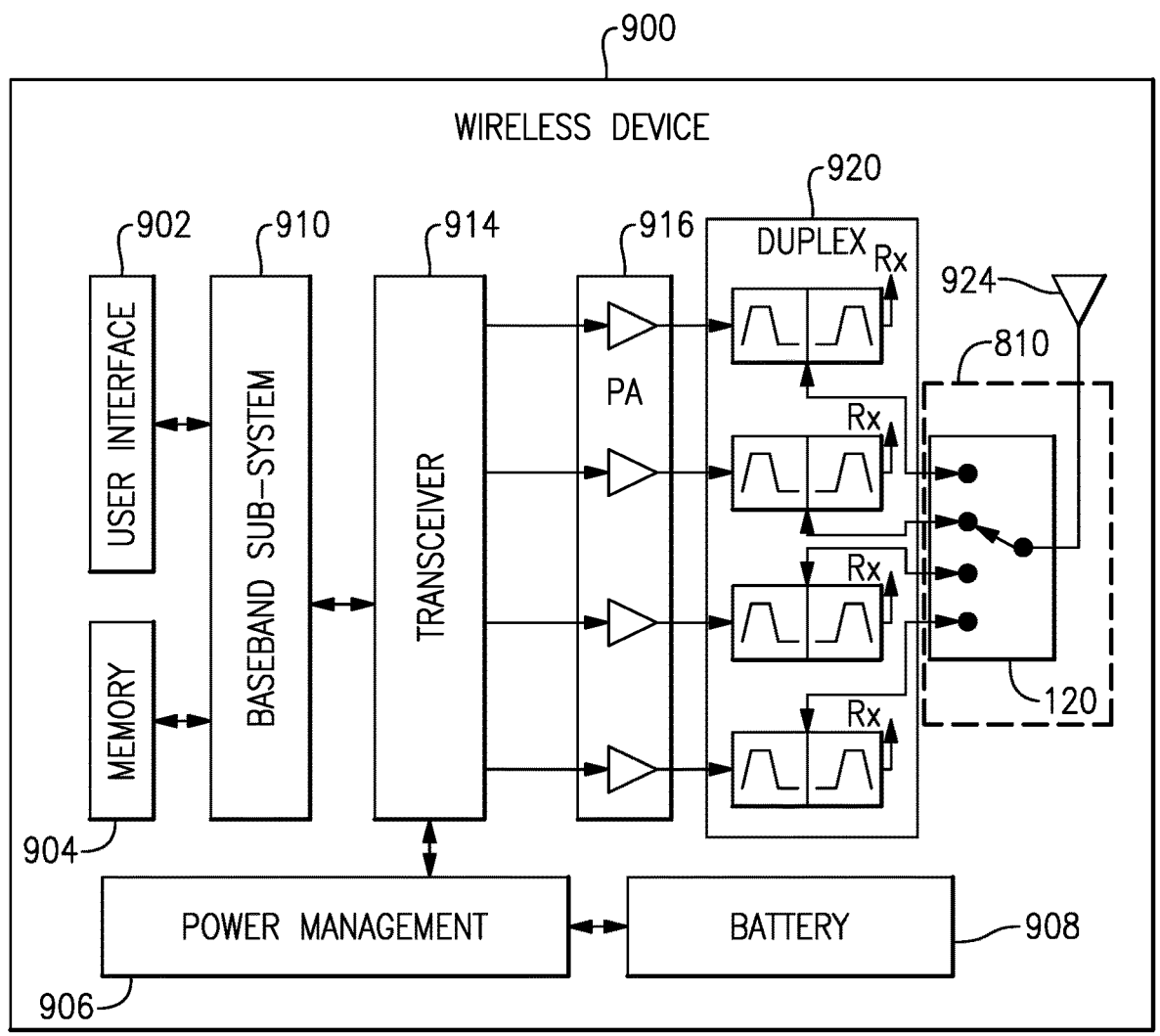
FIG. 21 depicts an example wireless device having one or more advantageous features described herein.

FIG. 21 schematically depicts an example wireless device 900 having one or more advantageous features described herein. In the context of various switches as described herein, a switch 120 can be part of a module 919, wherein the switch 120 may comprise low aspect ratio transistor switches according to one or more embodiments disclosed herein. Furthermore, other components of the device 900 may include integrated active/passive die(s) as described herein, such as the power amplifier module 914, duplexer 920 and/or other components or combinations thereof. In some embodiments, the switch module 919 can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 919.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 21, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A transistor device comprising:
a plurality of drain fingers that are elongate in a first dimension, the plurality of drain fingers being summed at an end thereof along a first drain summing bar that is elongate in a second dimension that is orthogonal to the first dimension;
a plurality of source fingers that are elongate in the first dimension and interleaved with the plurality of drain fingers, the plurality of source fingers being summed at an end thereof along a first source summing bar that is elongate in the second dimension;
a plurality of drain contact bars extending over a first set of the plurality of drain fingers and a first set of the plurality of source fingers in the second dimension;
a second drain summing bar extending in the first dimension and contacting each of the plurality of drain contact bars;
a plurality of source contact bars that are interleaved with the plurality of drain contact bars in the first dimension and extend over a second set of the plurality of drain fingers and a second set of the plurality of source fingers in the second dimension; and
a second source summing bar summing bar extending in the first dimension and contacting each of the plurality of source contact bars.

2. The transistor device of claim 1 further comprising a plurality of gate fingers that are elongate in the first dimension, the plurality of gate fingers being summed at an end thereof along a gate summing bar that is elongate in the second dimension and overlays one of the first drain summing bar or the first source summing bar.

3. The transistor device of claim 2 wherein the plurality of gate fingers are disposed between adjacent ones of the plurality of source fingers and the plurality of gate fingers.

4. The transistor device of claim 3 wherein the first lateral channel is on a first side of the plurality of drain fingers and the plurality of source fingers and the second lateral channel is on a second side of the plurality of drain fingers and the plurality of source fingers.

5. The transistor device of claim 1 wherein the first set of the plurality of drain fingers and the second set of the plurality of drain fingers each include all of the plurality of drain fingers.

6. The transistor device of claim 1 wherein the plurality of drain contact bars do not overlap with the plurality of source contact bars in the second dimension.

7. The transistor device of claim 1 wherein the plurality of drain contact bars electrically contact the first set of the plurality of drain fingers and the plurality of source contact bars electrically contact the second set of the plurality of source fingers.

8. The transistor device of claim 1 further comprising a plurality of gate fingers that are elongate in the first dimension and interleaved with the plurality of drain fingers and the plurality of source fingers.

9. The transistor device of claim 8 wherein the plurality of gate fingers are electrically coupled to a channel that extends in the second dimension.

10. The transistor device of claim 8 wherein a lateral dimension of the transistor device is proportional to a unit gate width of the plurality of gate fingers.

11. The transistor device of claim 10 wherein the plurality of drain fingers and the plurality of source fingers are associated with a first transistor, the first transistor being connected in series with a second transistor having source and drain fingers that are elongate in the second dimension.

12. The transistor device of claim 11 wherein a lateral dimension of the first transistor is substantially equal to a lateral dimension of the second transistor.

13. The transistor device of claim 11 wherein the first transistor has a higher OFF-capacitance than the second transistor.

14. The transistor device of claim 11 wherein the first transistor has different ON-resistance characteristics than the second transistor.

* * * * *